United States Patent
Kwon et al.

(10) Patent No.: US 12,159,058 B2
(45) Date of Patent: Dec. 3, 2024

(54) HIGH-PERFORMANCE INPUT BUFFER AND MEMORY DEVICE HAVING THE SAME

(71) Applicant: Yangtze Memory Technologies Co., Ltd., Wuhan (CN)

(72) Inventors: Gyuwan Kwon, Wuhan (CN); Sangoh Lim, Wuhan (CN); Hang Song, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 17 days.

(21) Appl. No.: 17/450,747

(22) Filed: Oct. 13, 2021

(65) Prior Publication Data
US 2022/0326883 A1 Oct. 13, 2022

Related U.S. Application Data

(63) Continuation of application No. PCT/CN2021/085780, filed on Apr. 7, 2021.

(51) Int. Cl.
*G06F 3/06* (2006.01)

(52) U.S. Cl.
CPC ............ *G06F 3/0659* (2013.01); *G06F 3/061* (2013.01); *G06F 3/0679* (2013.01)

(58) Field of Classification Search
CPC ....... G06F 3/0659; G06F 3/0671; G06F 3/061
See application file for complete search history.

(56) References Cited

U.S. PATENT DOCUMENTS

| | | | |
|---|---|---|---|
| 5,949,252 A | 9/1999 | Taguchi | |
| 6,425,041 B1 * | 7/2002 | Klein | G06F 13/362 |
| | | | 710/306 |
| 2007/0268775 A1 | 11/2007 | Han | |
| 2012/0170383 A1 | 7/2012 | Oh | |
| 2012/0170384 A1 | 7/2012 | Oh | |
| 2021/0043240 A1 | 2/2021 | Mun et al. | |
| 2022/0083270 A1 * | 3/2022 | Suzuki | G06F 3/0679 |

FOREIGN PATENT DOCUMENTS

| | | |
|---|---|---|
| CN | 101568903 A | 10/2009 |
| CN | 103493002 A | 1/2014 |
| JP | H03125394 A | 5/1991 |
| KR | 20210017291 A | 2/2021 |

OTHER PUBLICATIONS

The World Intellectual Property Organization (WIPO) International Search Report for PCT/CN2021/085780 Jan. 6, 2022 4 pages.

* cited by examiner

*Primary Examiner* — Kalpit Parikh
(74) *Attorney, Agent, or Firm* — Anova Law Group, PLLC

(57) ABSTRACT

A method for operating a memory device includes receiving an input that includes a command signal, an address signal, and a data signal, transmitting the command signal or the address signal to a low speed buffer, and transmitting the data signal to a high speed buffer.

20 Claims, 10 Drawing Sheets

100

200

HIGH-PERFORMANCE INPUT BUFFER AND MEMORY DEVICE HAVING THE SAME

CROSS-REFERENCE TO RELATED APPLICATION

This application claims the priority to PCT Patent Application No. PCT/CN2021/085780 filed on Apr. 7, 2021, the entire content of which is incorporated herein by reference.

FIELD OF THE TECHNOLOGY

This application relates to the field of semiconductor technology and, specifically, to a three-dimensional (3D) memory device, an input buffer structure, and a method of configuring input buffers.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

As the input/output (I/O) speed of a NAND device increases, more static power is consumed during the idle cycle. For example, the bus idle current can become larger when the I/O speed is higher. There is a challenge to speed up I/O performance while meeting power consumption requirement in a NAND device. The disclosed systems and methods are directed to solve one or more problems set forth above and other problems.

SUMMARY

In one aspect of the present disclosure, a method for operating a memory device includes receiving an input that includes a command signal, an address signal, and a data signal via an input/output (I/O) component, transmitting the command signal or the address signal to a low speed buffer, and transmitting the data signal to a high speed buffer.

In another aspect of the present disclosure, a memory device includes an I/O component for receiving an input that includes a command signal, an address signal, and a data signal, a low speed buffer for buffering the command signal or the address signal, and a high speed buffer for buffering the data signal. The I/O component is adaptable to transmit the command signal or the address signal to the low speed buffer and transmit the data signal to the high speed buffer.

In another aspect of the present disclosure, a method for operating a memory device includes receiving an input that includes a command signal, an address signal, and a data signal, enabling a low speed buffer, performing a command cycle to buffer the command signal or performing an address cycle to buffer the address signal using the low speed buffer, enabling a high speed buffer, and performing a data input cycle to buffer the high speed signal using the high speed buffer.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
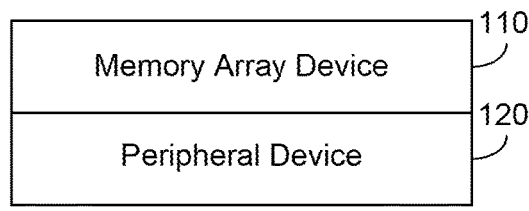
FIG. 1 illustrates a cross-sectional view of an exemplary three-dimensional (3D) memory device according to various embodiments of the present disclosure.

FIG. 1 schematically shows a cross-sectional view of an exemplary 3D memory device 100 according to embodiments of the present disclosure. The 3D memory device 100 may be a discrete memory device working individually. The 3D memory device 100 may also be a part of a memory system that has multiple memory devices 100. In some embodiments, the 3D memory device 100 may be coupled to or embedded in a host device (not shown). The host device may include a computing device such as a mobile phone, a smart phone, a smart watch, a tablet computer, a laptop computer, a personal computer, a data server, and a workstation, among other host devices.

Optionally, the 3D memory device 100 may include a memory array device 110 and a peripheral device 120. The memory array device 110 may include memory cells that form one or more 3D arrays. The peripheral device 120 may include a circuitry including a control circuit to control operations of the 3D memory device 100. In some embodiments, the memory array device 110 and the peripheral device 120 may be fabricated separately and then bonded together to form a stack-like structure, as shown in FIG. 1. Alternatively, the memory array device 110 and the peripheral device 120 may be integrated into one device. For example, the peripheral device 120 may be fabricated first and then the memory array device 110 may be made over the peripheral device 120 and using the peripheral device 120 as a substrate. In some other embodiments, the memory array device 110 and the peripheral device 120 may be fabricated separated and then mounted side by side on a printed circuit board (PCB).

Figure 2:
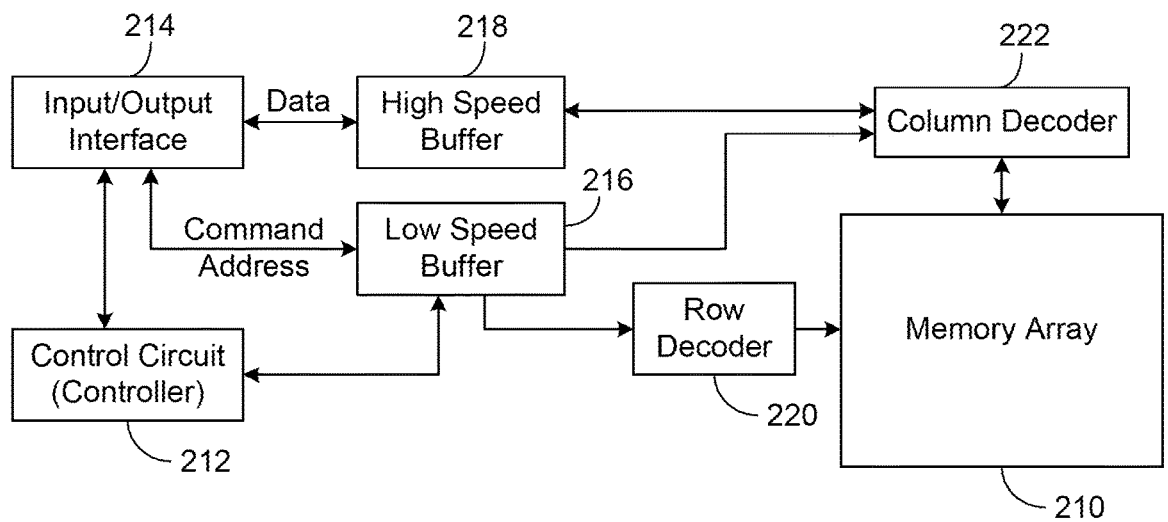
FIG. 2 illustrates a block diagram of a 3D memory device according to various embodiments of the present disclosure.

FIG. 2 shows a block diagram of a 3D memory device 200 according to embodiments of the present disclosure. The 3D memory device 200 may include a memory array 210 and a control circuit 212 that functions as a controller of the 3D memory device 200. The memory array 210 may include a 3D array of memory cells (not shown). The memory cells may include Not-AND (NAND) memory cells, Not-OR (NOR) memory cells, and/or memory cells of other types. Optionally, the memory array 210 may also include a two-dimensional (2D) array of memory cells (not shown) that contains NAND memory cells, NOR memory cells, and/or memory cells of other types. The 3D memory device 200 may further include an input/output (I/O) interface 214, a low speed buffer 216, a high speed buffer 218, a row decoder 220, and a column decoder 222. In some embodiments, the term "low speed" as used herein may indicate a speed lower than 100 megahertz (MHz), and the term "high speed" as used herein may indicate a speed equal to or higher than 1 gigahertz (GHz). Optionally, in some other cases, the "high speed" and "low speed" may be defined relatively to each other and may indicate that the "high speed" is at least one magnitude faster than the "low speed". That is, a high speed buffer may be at least one magnitude faster than a low speed buffer. The control circuit 212 may implement various functions of the 3D memory device 200. For example, the control circuit 212 may implement read operations, write operations, and erase operations. The I/O interface 214, which may also be referred to as an I/O component or I/O connections, may contain an I/O circuit to receive an input of command signals, address signals, and data signals to the 3D memory device 200 and transmit data and status information from the 3D memory device 200 to another device (e.g., a host device). The low speed buffer 216 may also be referred to as a low speed page buffer that buffers or temporarily stores command/address signals, while the high speed buffer 218 may also be referred to as a high speed page buffer that buffers or temporarily stores data signals. The row decoder 220 and column decoder 222 may decode row and column address signals respectively for accessing the memory array 210. The row decoder 220 and column decoder 222 may also receive different voltages from a voltage generator circuit (not shown) and transfer the received voltages to selected objects, such as a word line or bit line of the memory array 210.

The I/O interface 214 may detect command signals, address signals, and data signals from the input. In some embodiments, the I/O interface 214 may transmit command and/or address signals to the low speed buffer 216, and transmit data signals to the high speed buffer 218. Optionally, the I/O interface 214 may transmit command and/or address signals to the low speed buffer 216 only, and transmit data signals to the high speed buffer 218 only. In some cases, the control circuit 212 may transmit the command, address, and data signals to the buffers 216 and 218 by sending instructions to the I/O interface 214. The low speed buffer 216 may include one or more low speed buffers and be configured to receive and buffer command signals, address signals, and/or other signals that does not require high speed processing. When the low speed buffer 216 contains multiple low speed buffers, one of the low speed buffers may be used to store command signals and another of the low speed buffers may be used to store address signals. The high speed buffer 218 may include one or more high speed buffers and be configured to receive and buffer data signals and/or other signals that requires high speed processing.

At some memory devices, all of the command signals, the address signals, and the data signals are sent to a high speed buffer from an I/O interface to facilitate a high speed operation. Thereafter, the high speed buffer passes the command/address signals to a command/address latch and the data signals to a deserializer. The command/address signals are latched to accept command/address sequence with a write enable (WE_n) cycle. The data signals are deserialized to make parallel data for writing cache data in high speed clock cycle synchronized with data strobe (DQS) signals (e.g., DQS_t or DQS_c signals). However, the high speed buffer consumes high static power and requires a fast reference bias wake-up process. The data signals need a high speed buffer for high speed operations. For example, the speed of data signal sent to a buffer may reach at least 1 GHz in some cases. But for command/address signals, a speed below 100 MHz may be fast enough to support operations in a WE_n cycle. Thus, command/address signals may not need a high speed operation in certain cases. A low speed buffer may provide adequate efficiency for command/address signals in those cases.

As shown in FIG. 2, the low speed buffer 216 is configured for receiving and buffering command and/or address signals, while the high speed buffer 218 is configured for receiving and buffering data signals. In some embodiments, command/address signals may be passed to the low speed buffer 216 only, and data signals may be passed to the high speed buffer 218 only. Because the command/address signals are processed by the low speed buffer 216, the static power in idle mode may be reduced compared to a scenario where a high speed buffer is arranged for all input signals. Also because the command/address signals are processed by the low speed buffer 216, the active power may be reduced as well. Further, while the static power consumption is under control, the operation frequency of the high speed buffer 218 may be increased to improve the high speed performance of the 3D memory device 200.

Figure 3:
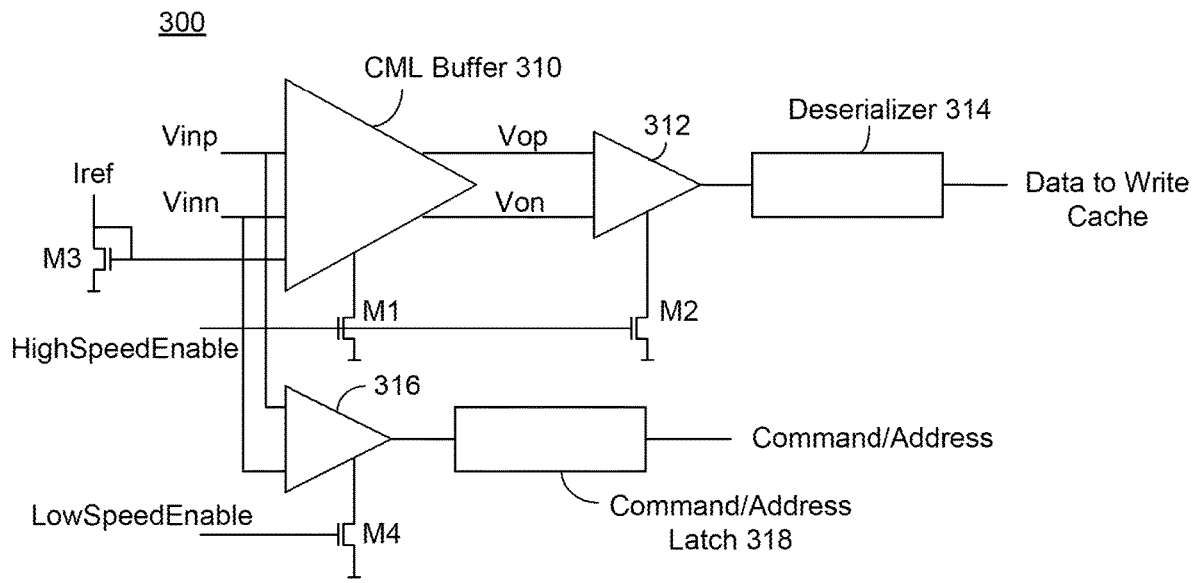
FIG. 3 illustrates a block diagram of a high speed path and a low speed path according to various embodiments of the present disclosure.

FIG. 3 shows a block diagram 300 of a high speed path and a low speed path arranged for processing input signals for a memory device according to embodiments of the present disclosure. The high speed path may be configured for propagating and processing data signals, and the low speed path may be configured for propagating and processing command/address signals. The high speed path may include devices such as a current-mode logic (CIVIL) buffer 310, an amplifier 312, and a deserializer 314. CIVIL buffers are based on differential circuits. For example, the CML buffer 310 may receive differential input signals Vinp and Vinn and generate differential output signals Vop and Von. While CIVIL buffers can operate with low signal voltage and high speed (e.g., 1 GHz) at low supply voltage, they suffer from drawing a high static current to stay at common mode. The high speed path may include multiple CML buffers (not shown). The amplifier 312 may be, for example, a differential operational amplifier. A differential operational amplifier amplifies the difference between two input signals, such as two input voltages. The high speed path may include multiple amplifiers, e.g., multiple amplifiers 312. The deserializer 314 may include a deserializing circuit that converts serial data into parallel data. The parallel data may be sent to a write cache and stored there temporarily before being written to a memory array.

The low speed path may include an amplifier 316 and a command/address latch 318. Similar to the amplifier 312, the amplifier 316 may be, for example, a differential operational amplifier. The low speed path may include multiple amplifiers, e.g., multiple amplifiers 316. The command/address latch 318 may latch the command/address signals that will be transmitted to a row decoder and a column decoder.

A metal-oxide-semiconductor field-effect transistor (MOSFET) M1 may be connected with and provide a HighSpeedEnable signal to the CIVIL buffer 310. A MOSFET M2 may be connected with and provide a HighSpeedEnable signal to the amplifier 312. A MOSFET M3 may be connected with and provide a reference signal to the CIVIL buffer 310. A MOSFET M4 may be connected with and provide a LowSpeedEnable signal to the amplifier 316. The term "connected" as used herein, indicates electrically connected.

Hence, input signals received at a memory device may be split into two parts. One part contains data signals, while the other part contains command/address signals. The data signals may be transmitted and buffered along a high speed path, and the command/address signals may be transmitted and buffered along a low speed path. In some embodiments, the data signals may be transmitted and buffered along a high speed path only, and the command/address signals may be transmitted and buffered along a low speed path only. Because the command/address signals are not passed along the high speed path, the static power consumption of the memory device may be under control when a high speed operation is performed at the memory device.

Figure 4:
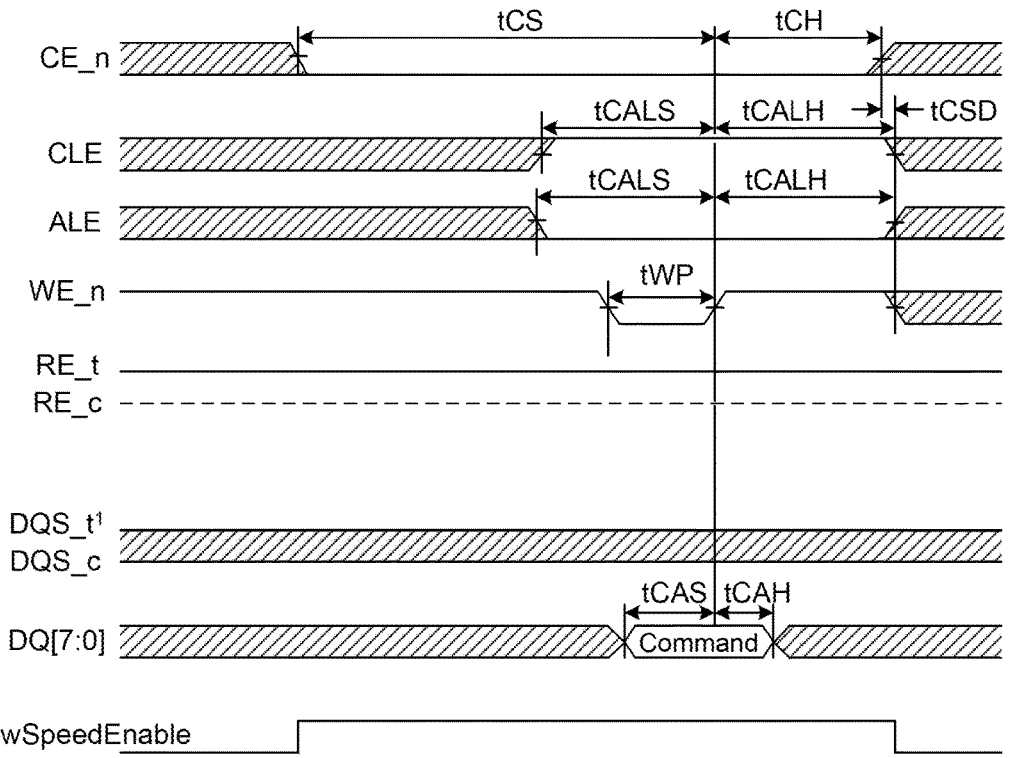
FIG. 4 illustrates a timing diagram of a command cycle according to various embodiments of the present disclosure.

FIG. 4 shows a schematic timing diagram 400 of a command cycle of a memory device according to various embodiments of the present disclosure. The command cycle may include command signals such as a chip enable (CE_n) signal, a command latch enable (CLE) signal, an address latch enable (ALE) signal, a WE_n signal, a read enable (RE_t) signal, a read enable complement (RE_c) signal, a DQS_t signal, a DQS_c signal, and a DQ[7:0] signal. The CE_n signal may be used to select a NAND target. A NAND target may include a set of logical units (LUNs) that share one CE_n signal within a NAND package. tCS is CE_n setup time and tCH is CE_n hold time. The CLE signal may be used to indicate the type of a bus cycle (e.g., a command bus cycle, an address bus cycle, or a data bus cycle). The ALE signal may also be used to indicate the type of a bus cycle (e.g., a command bus cycle, an address bus cycle, or a data bus cycle). tCALS is CLE and ALE setup time and tCALH is CLE and ALE hold time. tCSD is ALE, CLE, WE_n hold time from CE_n high. The WE_n signal may be used to control latching of commands, addresses, and input data. tWP is WE_n low pulse width. The RE_t signal may be used to enable serial data output. The RE_c signal is the complementary signal to the RE_t signal. The DQS_t signal is the data strobe signal and the DQS_c signal is the complementary signal to the DQS_t signal. The DQ[7:0] signal is the data I/O signal. tCAS is command/address DQ setup time and tCAH is command/address DQ hold time.

Referring to FIG. 4, the LowSpeedEnable signal is used to enable a low speed buffer for the command cycle. For example, a low speed buffer may be enabled at the start of tCS and disenabled at the end of tCH. As illustrated above, command signals may be passed to the low speed buffer and buffered with a low speed. Hence, static power consumption of the memory device may be reduced compared to cases where command signals are buffered using a high speed buffer.

Figure 5:
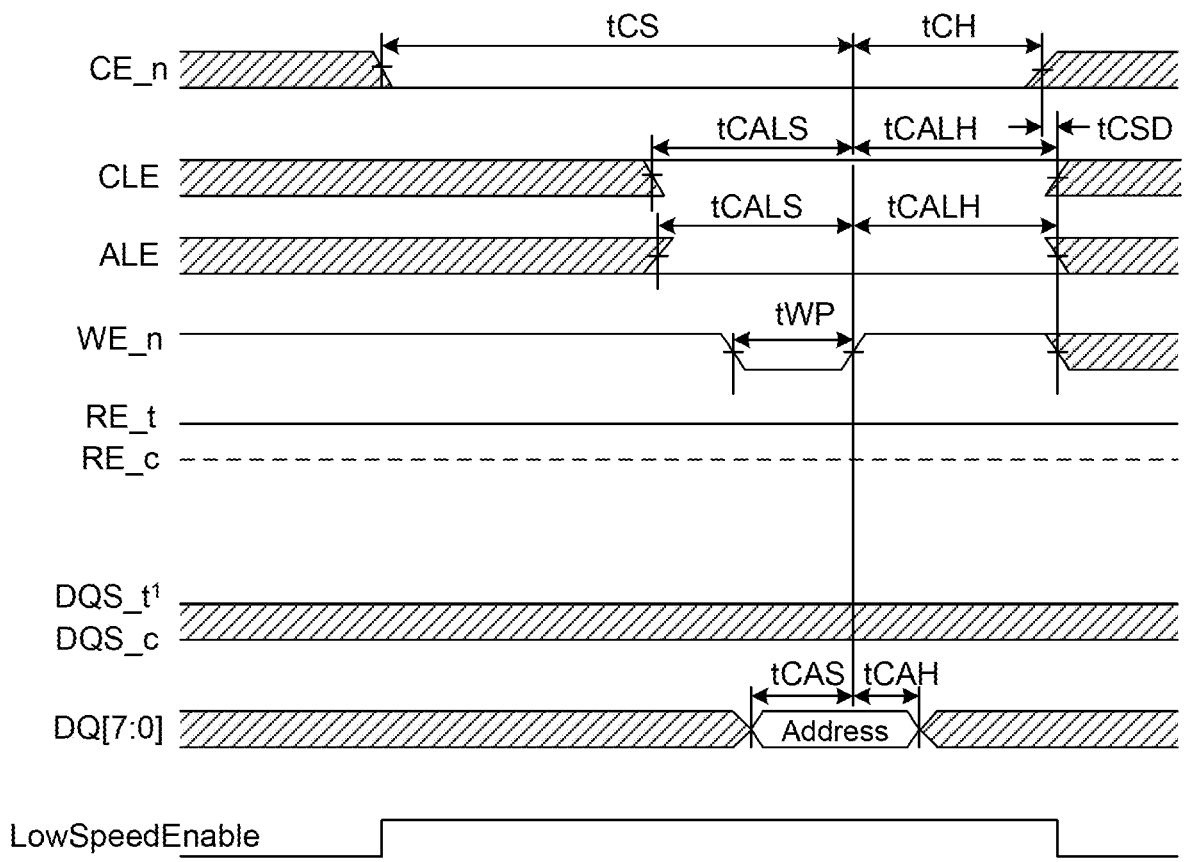
FIG. 5 illustrates a timing diagram of an address cycle according to various embodiments of the present disclosure.

FIG. 5 shows a schematic timing diagram 500 of an address cycle of a memory device according to various embodiments of the present disclosure. The address cycle may have similar command signals to those of the command cycle with reference to FIG. 4, such as a CE_n signal, a CLE signal, an ALE signal, a WE_n signal, a RE_t signal, a RE_c signal, a DQS_t signal, a DQS_c signal, and a DQ[7:0] signal. The LowSpeedEnable signal may be used enable a low speed buffer for the address cycle. For example, a low speed buffer may be enabled at the start of tCS and disenabled at the end of tCH. As illustrated above, address signals may be passed to the low speed buffer and buffered with a low speed. Hence, static power consumption of the memory device may be reduced compared to scenarios where address signals are buffered using a high speed buffer.

Optionally, idle mode of the memory device may only be implemented when the low speed buffer is enabled and the high speed buffer is in standby mode or off mode. In some embodiments, the command cycle or address cycle is performed using the low speed buffer only. That is, command/address signals are buffered using the low speed buffer only. Thus, lower active power and lower static power may be achieved compared to cases where a high speed buffer is used to buffer command/address signals.

Figure 6:
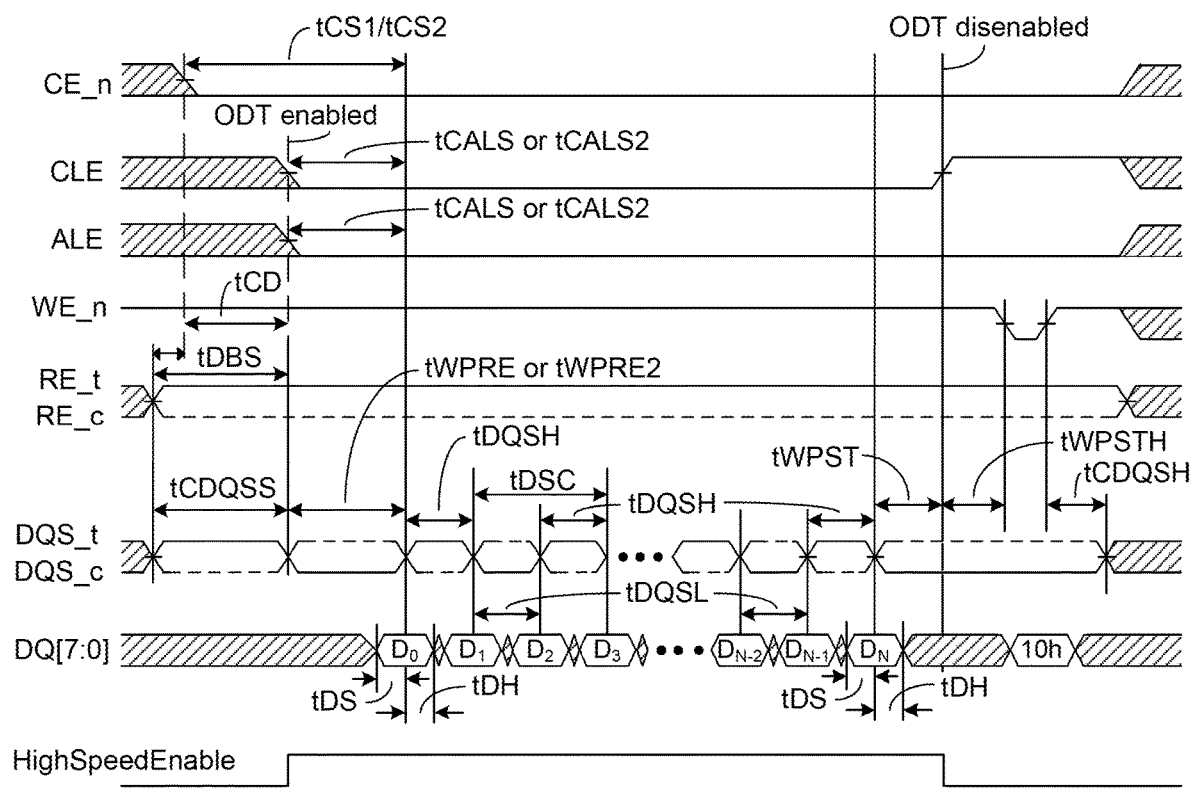
FIG. 6 illustrates a timing diagram of a data input cycle according to various embodiments of the present disclosure.

FIG. 6 shows a schematic timing diagram 600 of a data input cycle of a memory device according to various embodiments of the present disclosure. The data input cycle may have command signals such as a CE_n signal, a CLE signal, an ALE signal, a WE_n signal, a RE_t signal, a RE_c signal, a DQS_t signal, a DQS_c signal, and a DQ[7:0] signal. tCS1 is CE_n setup time for data burst with on-die termination (ODT) disabled, and tCS2 is CE_n setup time with DQS/DQ[7:0] ODT enabled. While tCALS is CLE and ALE setup time, tCALS2 is CLE and ALE setup time when ODT is enabled. tCD is CE_n setup time to DQS (DQS_t) low after CE_n has been high for greater than 1 microsecond. tDBS is DQS (DQS_t) high and RE_n (RE_t) high setup to ALE, CLE and CE_n low during data burst. tCDQSS is DQS setup time for data input start. tWPRE is DQS write preamble and tWPRE2 is DQS write preamble when ODT is enabled. tDQSH is DQS high level width, while tDQSL is DQS low level width. tDSC is DQS cycle time. tDS is data setup time. tDH is data hold time. tWPST is DQS write postamble. tWPSTH is DQS write postamble hold time. tCDQSH is DQS hold time for data input burst end. $D_0$-$D_N$ are data bytes/words to be written to the addressed page. 10h is the second cycle of a page program command.

Referring to FIG. 6, the HighSpeedEnable signal may be used to enable a high speed buffer for the data input cycle. For example, a high speed buffer may be enabled when ODT is enabled and disenabled when ODT is disenabled. As illustrated above, data input signals may be passed to the high speed buffer and buffered with a high speed. At idle mode, the high speed buffer may be disenabled. Hence, static power consumption of the memory device at idle mode may be reduced compared to cases where the high speed buffer remains enabled at idle mode.

Figure 7:
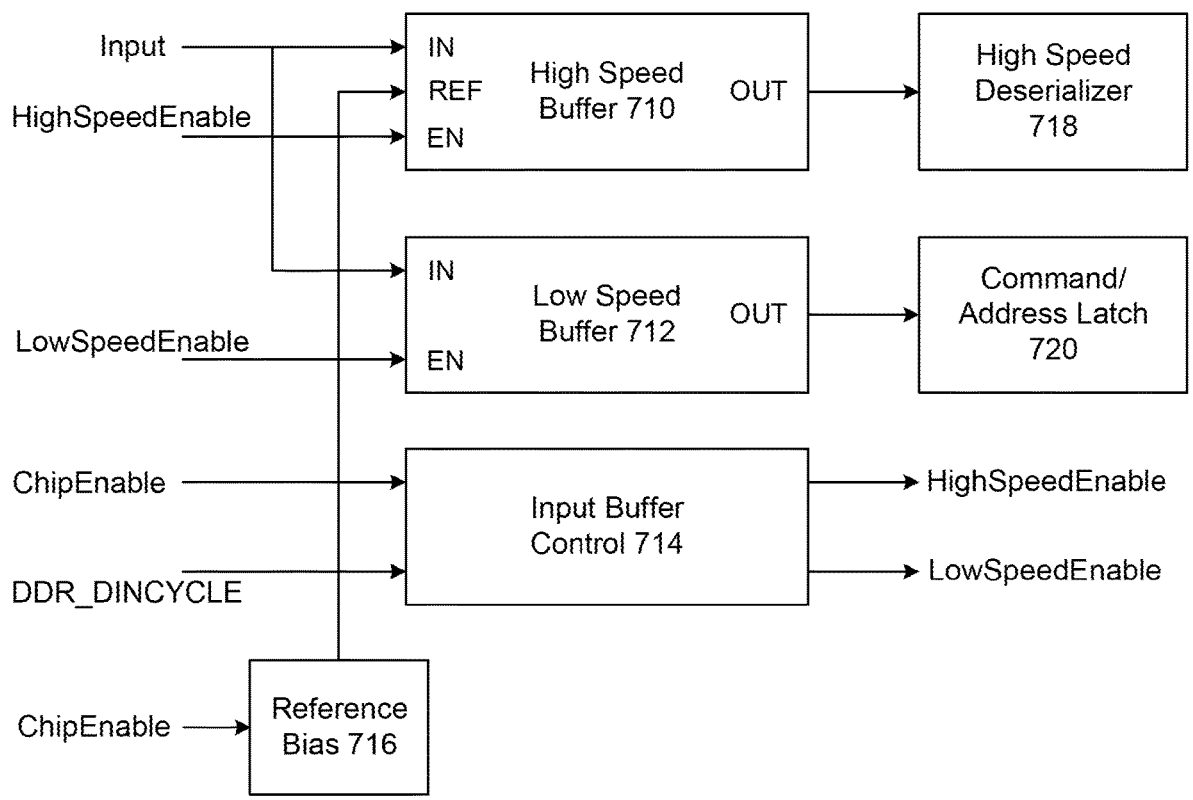
FIG. 7 illustrates a block diagram of buffer configuration according to various embodiments of the present disclosure.

FIG. 7 shows a schematic block diagram 700 of a buffer configuration of a memory device according to embodiments of the present disclosure. The buffer configuration may include a high speed buffer 710, a low speed buffer 712, an input buffer control 714, a reference bias 716, a high speed deserializer 718, and a command/address latch 720.

The input buffer control 714 may use a ChipEnable signal to select a NAND target, and use a DDR_DINCYCLE signal to detect a command signal, an address signal, and a data signal from input signals, respectively. When an input signal is a data signal, the input buffer control 714 may generate a HighSpeedEnable signal and transmit the HighSpeedEnable signal to the high speed buffer 710. The HighSpeedEnable signal enables the high speed buffer 710. When an input signal is a command signal or an address signal, the input buffer control 714 may generate a LowSpeedEnable signal and transmit the LowSpeedEnable signal to the low speed buffer 712. The LowSpeedEnable signal enables the low speed buffer 712. The ChipEnable signal may also enable the reference bias 716 that provides a reference signal to the high speed buffer 710 when the high speed buffer 710 is enabled. Input signals may include a command signal, an address signal, and/or a data signal and contain differential data or single ended data. The command/address signals are transmitted to the low speed 712. The data signal is transmitted to the high speed buffer 710. Further, the high speed buffer 710 may pass data signals to the high speed deserializer 718, and the low speed buffer 712 may transfer command/address signals to the command/address latch 720. In some embodiments, for the purpose of reducing active power and static power of the memory device, command/address signals are transmitted to the low speed buffer 712 only. Optionally, for the purpose of reducing static power of the memory device, idle mode of the memory device may be enabled only when the high speed buffer 710 is disenabled. As such, only the low speed buffer may be enabled at idle mode.

Figure 8:
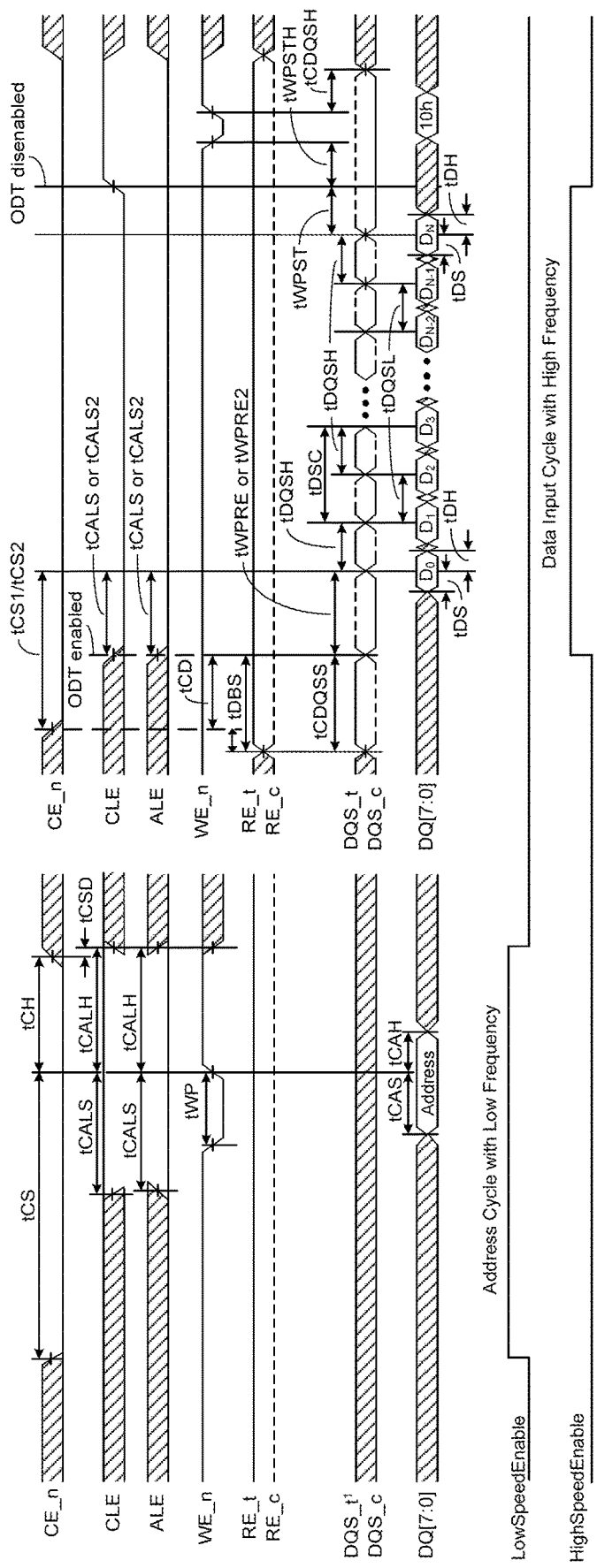
FIG. 8 illustrates a timing diagram of an address cycle and a data input cycle according to various embodiments of the present disclosure.

FIG. 8 shows a schematic timing diagram 800 of an address cycle and a subsequent data input cycle of a memory device according to various embodiments of the present disclosure. Optionally, the address cycle may be replaced by a command cycle. As shown in FIG. 8, the address cycle and data input cycle may have command signals such as CE_n signals, CLE signals, ALE signals, WE_n signals, RE_t signals, RE_c signals, DQS_t signals, DQS_c signals, and DQ[7:0] signals. The LowSpeedEnable signal may be used to enable a low speed buffer for the address cycle. The HighSpeedEnable signal may be used to enable a high speed buffer for the data input cycle. As illustrated above, address signals may be passed to the low speed buffer and buffered with low speed operations, and data input signals may be passed to the high speed buffer and buffered with high speed operations. For example, a low speed buffer may be enabled at the start of tCS and disenabled at the end of tCH. On the other hand, the high speed buffer may be enabled when ODT is enabled and disenabled when ODT is disenabled. At idle mode of the memory device, the low speed buffer may be enabled while the high speed buffer may be disabled to reduce static power consumption.

Referring to FIG. 8, a controller of the memory device may detect, for example, an address signal first. Further, a low speed buffer may be enabled by the controller. The address signal may be sent to the low speed buffer and an address cycle may be implemented using the low speed buffer. After the address cycle is completed and the low speed buffer is disenabled, the controller may detect a data signal. Thereafter, a high speed buffer may be enabled by the controller when ODT is enabled and the data signal may be sent to the high speed buffer. A data input cycle may be implemented using the high speed buffer. When ODT is disenabled, the high speed buffer is disenabled and the data input cycle ends. Hence, when the address cycle and/or command cycle is performed, the high speed buffer is disenabled. The high speed buffer is enabled when the data input cycle is performed, or only when the data input cycle is performed at a page program operation. Thus, compared to scenarios of using a high speed buffer to store command/address data, the active power and static power of the memory device may be reduced.

Figure 9:
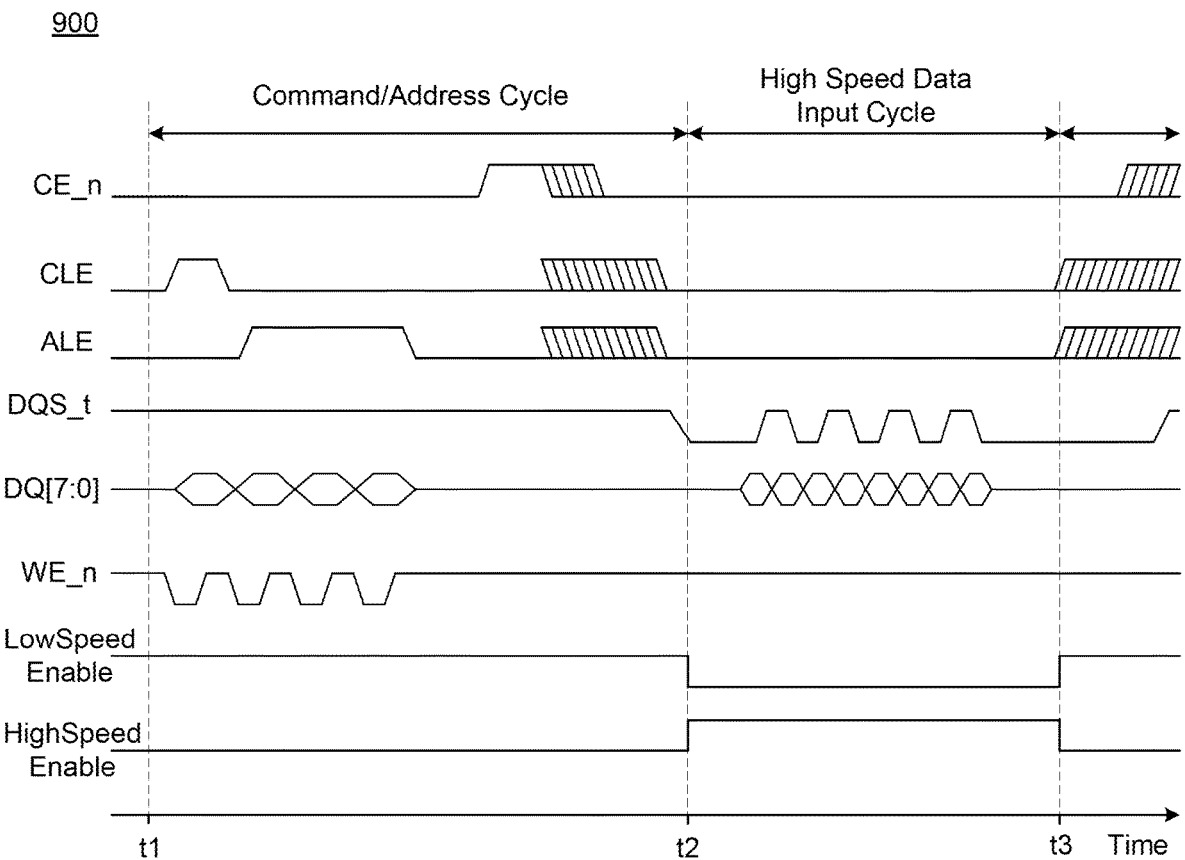
FIG. 9 illustrates a timing diagram of a command/address cycle and a data input cycle according to various embodiments of the present disclosure.

FIG. 9 illustrates a schematic timing diagram 900 of a low speed command/address cycle and a high speed data input cycle of a memory device according to various embodiments of the present disclosure. The memory device includes a controller to control certain operations. As shown in FIG. 9, the operations may include command signals such as CE_n signals, CLE signals, ALE signals, DQS_t signals, DQ[7:0] signals, WE_n signals, LowSpeedEnable signals, and HighSpeedEnable signals. Other command signals are omitted in FIG. 9 for simplicity. As illustrated above, the LowSpeedEnable signal is used to enable a low speed buffer for the low speed command/address cycle, while the HighSpeedEnable signal is used to enable a high speed buffer for the high speed data input cycle. The command/address signals may be transmitted to the low speed buffer and buffered with low speed operations, and the data input signals may be transmitted to the high speed buffer and buffered with high speed operations.

Referring to FIG. 9, the LowSpeedEnable signals may be high and the HighSpeedEnable signals may be low during a time period before time t1 and between t1 and t2. As such, the low speed buffer may be enabled and the high speed buffer may be disabled by the controller during the time period. The controller may use the DQ[7:0] signal to obtain the command/address signals, and use the WE_n signal to control latching of the command/address signals. The command/address signal may be latched in the low speed command/address cycle at the low speed buffer.

At time t2, when the command/address cycle is completed and the CE_n/CLE/ALE/DQS_t signals (i.e., the CE_n signals, CLE signals, ALE signals, and DQS_t signals) are low, the controller may activate the high speed mode by making the HighSpeedEnable signal high, and deactivate the low speed mode by making the LowSpeedEnable signal low. That is, the high speed buffer may be enabled and the low speed buffer may be disenabled. Thereafter, the high speed data input cycle may be performed at the high speed buffer by the controller. At time t3, the controller may make the HighSpeedEnable signal low and the LowSpeedEnable signal high. Then, the high speed buffer may be disenabled and the low speed buffer may be enabled, and another command/address cycle may be performed.

Figure 10:
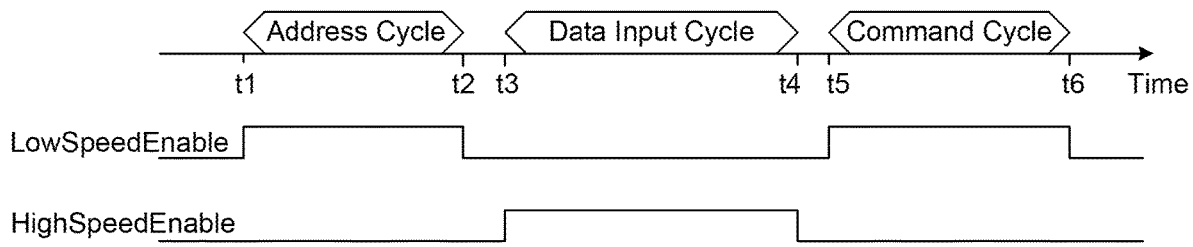
FIGS. 10-14 each illustrate a timing diagram including command, address, and data input cycles according to various embodiments of the present disclosure.

FIG. 10 shows a schematic timing diagram 1000 including an address cycle, a command cycle, and a data input cycle for a memory device according to various embodiments of the present disclosure. After an I/O interface of the memory device receives an input, a controller of the memory device may make the I/O interface pass command/address signals of the input to a low speed buffer and pass data signals to a high speed buffer. The command signal, address signal, and data signal may be transmitted from the I/O interface in series. A command cycle, address cycle, and data input cycle may be performed in series. For example, at time t1, the controller may enable the low speed buffer and perform an address cycle. The address cycle may end at time t2 when the low speed buffer is disenabled. Then, the controller may enable the high speed buffer and perform a data input cycle at time t3. In some embodiments, the high speed mode is activated and the high speed buffer is enabled when the CE_n/CLE/ALE/DQS_t signals are low. The controller may disenable the high speed buffer and terminate the data input cycle at time t4. At time t5, the controller may enable the low speed buffer again and implement a command cycle, which may end when the low speed buffer is disenabled at time t6. As such, the address and command cycles may be performed using the low speed buffer. Further, when the address and command cycles are performed, the high speed buffer may be disenabled to reduce power consumption at active mode. The high speed buffer may be enabled only when the data input cycle is performed.

Figure 11:
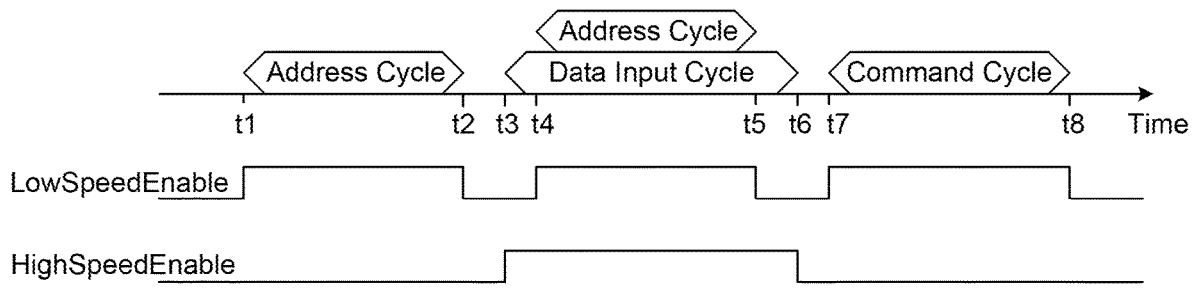

FIG. 11 shows a schematic timing diagram 1100 for performing address cycles, command cycles, and data input cycles for a memory device according to various embodiments of the present disclosure. The memory device may include I/O connections, a low speed buffer, a high speed buffer, and a controller that controls operations of the memory device. After the I/O connections receive an input, command/address signals of the input may be sent to the low speed buffer and data signals may be sent to the high speed buffer. The command signal, address signal, and data signal may be transmitted from the I/O connections in series or in parallel. A command cycle, address cycle, and data input cycle may be performed by the controller in series or in parallel. For example, at time t1, the controller may enable the low speed buffer and perform a first address cycle. The first address cycle may end at time t2 when the low speed buffer is disenabled. Then, the controller may enable the high speed buffer and perform a data input cycle at time t3. In some embodiments, the high speed buffer is enabled when the CE_n/CLE/ALE/DQS_t signals are low. During the period of the data input cycle, the I/O connections may receive additional address signals. The controller may enable the low speed buffer and perform a second address cycle at time t4. The second address cycle and the data input cycle are implemented in parallel, as the two cycles are within the same time period from t4 to t5. During the time period from t4 to t5, an address signal and a data signal may be transmitted from the I/O connections to the low speed buffer and the high speed buffer at the same time. That is, in some aspects, an address signal (or a command signal) and a data signal may be transmitted from the I/O connections in parallel. The second address cycle may end at time t5 when the low speed buffer is disenabled. At time t6, the controller may disenable the high speed buffer and stop the data input cycle. At time t7, the controller may enable the low speed buffer again and implement a command cycle, which may end when the low speed buffer is disenabled at time t8. Hence, the address and command cycles may be performed only using the low speed buffer. Further, the high speed buffer may be enabled only when the data input cycle is performed.

Figure 12:
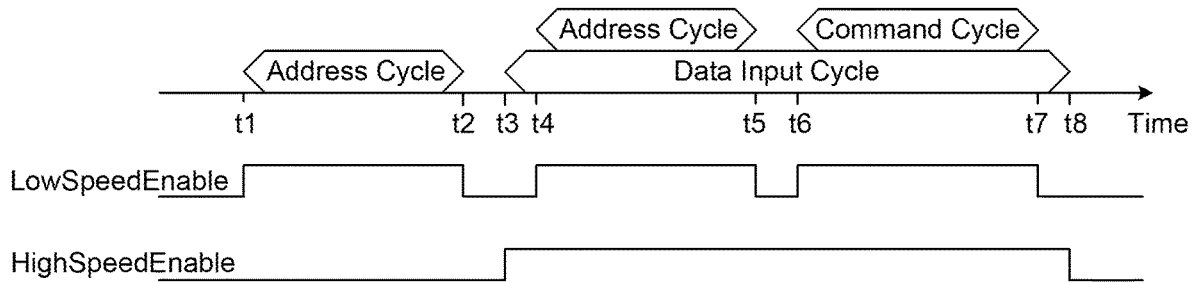

FIG. 12 shows a schematic timing diagram 1200 for performing address cycles, command cycles, and data input cycles for a memory device according to various embodiments of the present disclosure. The memory device may include I/O connections, a low speed buffer, a high speed buffer, and a controller that controls operations of the memory device. After the I/O connections receive an input, command/address signals of the input may be sent to the low speed buffer and data signals may be sent to the high speed buffer. In some embodiments, the I/O connections represent an I/O interface that may receive a command signal, an address signal, and a data signal at the same time, and transfer the command signal, address signal, and data signal to different destinations (e.g., different buffers) at the same time. The controller may enable the low speed buffer and perform a first address cycle at time t1. The first address cycle may end at time t2 when the low speed buffer is disenabled. Further, the controller may enable the high speed buffer and perform a data input cycle at time t3. In some embodiments, the high speed buffer is enabled when the CE_n/CLE/ALE/DQS_t signals are low. During the period of the data input cycle, the I/O connections may receive address and/or command signals. For example, the controller may enable the low speed buffer and perform a second address cycle using the low speed buffer at time t4. The second address cycle may end at time t5 when the low speed buffer is disenabled. At time t6, the controller may enable the low speed buffer again and perform a command cycle using the low speed buffer. The low speed buffer may be disenabled and the command cycle may end at time t7. The controller may disenable the high speed buffer and stop the data input cycle at time t8. Thus, the address and command cycles may be performed only using the low speed buffer. The high speed buffer may be enabled only when the data input cycle is performed.

Figure 13:
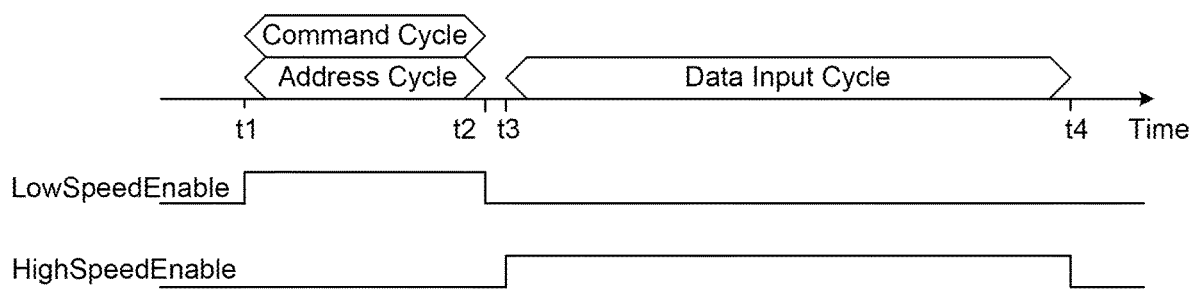

FIG. 13 shows a schematic timing diagram 1300 for performing address cycles, command cycles, and data input cycles for a memory device according to various embodiments of the present disclosure. The memory device may include I/O connections, one or more low speed buffers, a high speed buffer, and a controller that controls operations of the memory device. In response to receiving an input, the I/O connections may transfer command/address signals of the input to the one or more low speed buffers and data signals of the input to the high speed buffer, respectively. In some embodiments, the I/O connections may receive a command signal, an address signal, and a data signal at the same time, and transmit the command, address, and data signals to different destinations (e.g., different buffers) at the same time. The controller may enable the one or more low speed buffers and perform an address cycle and a command cycle at time t1. The address and command cycles may be executed by the controller simultaneously or in parallel. During the time period from t1 to t2, the address signal and command signal may be transmitted from the I/O connections to the one or more low speed buffers at the same time or in parallel. For example, the address signal and command signal may be transmitted from the I/O connections to a first low speed buffer and a second low speed buffer in parallel within the time period from t1 to t2. The address and command cycles may end at time t2 when the one or more low speed buffers are disenabled. At time t3, the controller may enable the high speed buffer and perform a data input cycle. At time t4, the controller may disenable the high speed buffer and conclude the data input cycle. Thus, the address and command cycles may be performed using the low speed buffer. In addition, the high speed buffer may be enabled only when the data input cycle is performed.

Figure 14:
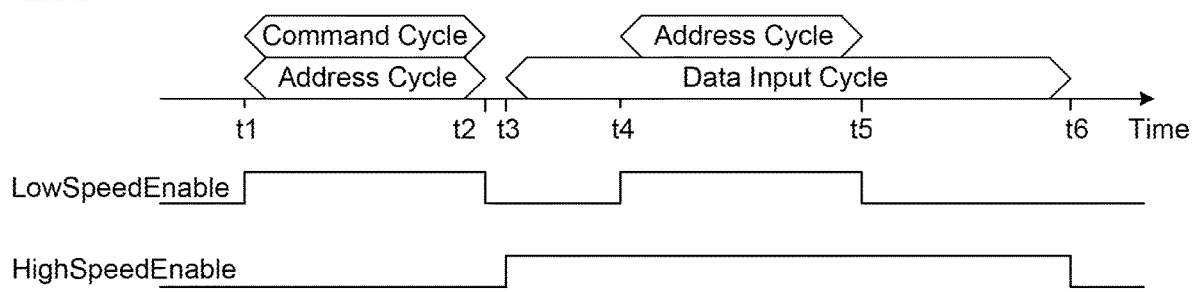

FIG. 14 shows a schematic timing diagram 1400 for performing address cycles, command cycles, and data input cycles for a memory device according to various embodiments of the present disclosure. The memory device may include I/O connections, one or more low speed buffers, a high speed buffer, and a controller that controls an operation of the memory device. In response to receiving an input, the I/O connections may transfer command/address signals of the input to the one or more low speed buffers and data signals of the input to the high speed buffer, respectively. In some embodiments, the I/O connections may receive a command signal, an address signal, and a data signal at the same time, and transmit the command, address, and data signals to different destinations at the same time. The controller may enable the one or more low speed buffers and perform a first address cycle and a command cycle at time t1. The first address cycle and the command cycle may be implemented by the controller simultaneously. The first address cycle and the command cycle may end at time t2 when the one or more low speed buffers are disenabled. At time t3, the controller may enable the high speed buffer and perform a data input cycle. During the period of the data input cycle, the I/O connections may receive additional address signals. The controller may enable one of the one or more low speed buffers and perform a second address cycle at time t4. Similarly, if additional command signals are received by the I/O connections, an additional command cycle may be performed by the controller between t3 and t6. The second address cycle may end at time t5 when the one of the one or more low speed buffers is disenabled. At time t6, the controller may disenable the high speed buffer and end the data input cycle. Thus, the address and command cycles may be performed using the low speed buffer. Further, the high speed buffer may be enabled only when the data input cycle is performed.

Figure 15:
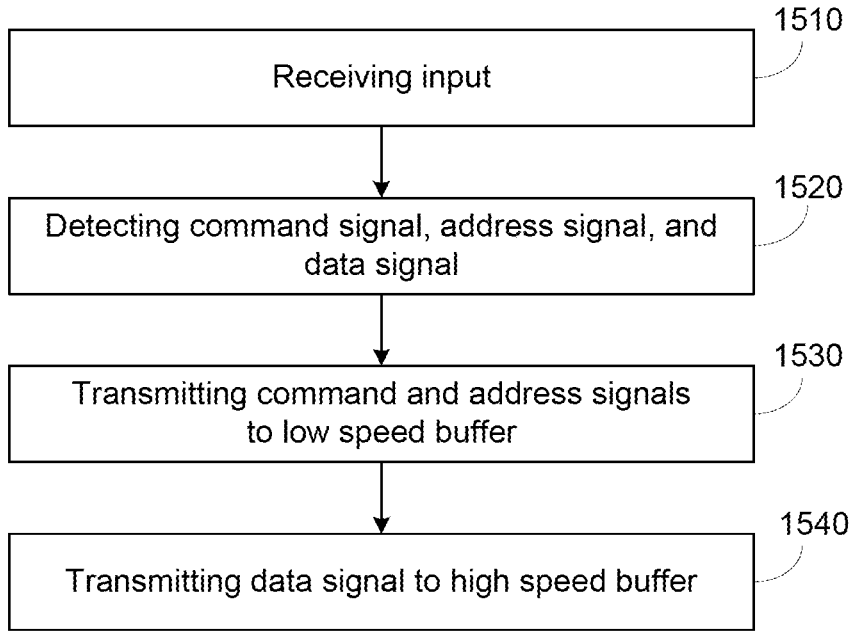
FIGS. 15-16 illustrate schematic flow charts showing methods of buffering input signals according to various aspects of the present disclosure.

FIG. 15 shows a schematic flow chart 1500 for describing methods of buffering input signals at a memory device according to embodiments of the present disclosure. The memory device may include a controller, an I/O interface, a low speed buffer, and a high speed buffer. The controller controls operations of the memory device.

At 1510, the I/O interface receives an input. The input may contain command signals, address signals, and data signals. The I/O interface may receive the signals in series or in parallel. At 1520, the I/O interface detects the command signals, address signals, and data signals from the input.

At 1530, the I/O interface transmits the command/address signals to the low speed buffer. Alternatively, the controller may prompt the I/O interface to transmit the command/address signals to the low speed buffer. In some embodiments, the I/O interface may send the command signals to the low speed buffer and the controller may perform one or more command cycles in one time period. The I/O interface may send the address signals to the low speed buffer and the controller may perform one or more address cycles in another time period. When the command or address cycle is performed, the low speed buffer is enabled and used to buffer the command or address signals. Optionally, when a command or address cycle is performed, only the low speed buffer is used to buffer command or address signals.

At 1540, the I/O interface transmits the data signals to the high speed buffer. Alternatively, the controller may prompt the I/O interface to transmit the data signals to the high speed buffer. In some embodiments, the I/O interface may send the data signals to the high speed buffer and the controller may perform one or more data input cycles in one time period. When the data input cycle is performed, the high speed buffer is enabled and used to buffer the data signals. In some embodiments, only when a data input cycle is performed, the high speed buffer may be enabled.

Figure 16:
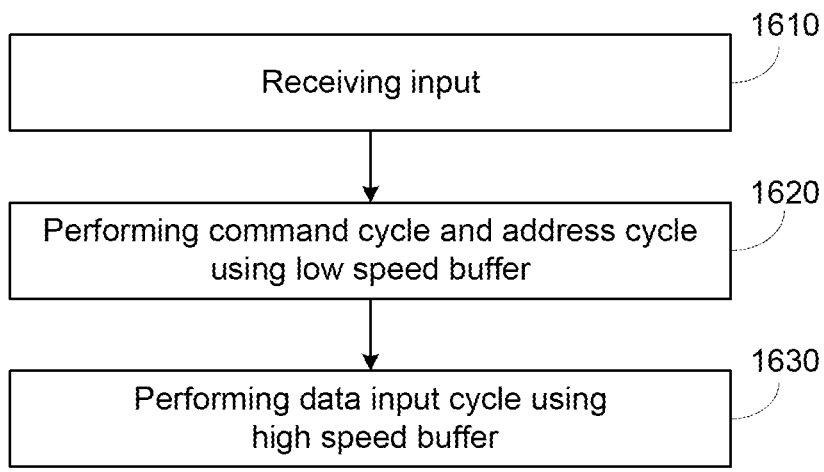

FIG. 16 shows a schematic flow chart 1600 for describing methods of buffering input signals at a memory device according to embodiments of the present disclosure. The memory device may include a controller, an I/O interface, a low speed buffer, and a high speed buffer. The controller controls operations of the memory device.

At 1610, the I/O interface receives an input. The input may contain command signals, address signals, and data signals. The I/O interface passes the command signals and the address signals to the low speed buffer, and passes the data signals to the high speed buffer.

At 1620, the controller enables the low speed buffer and performs a command cycle and an address cycle to buffer the command/address signals. After the low speed buffer is enabled, for example, the controller may perform a command cycle and subsequently, perform an address cycle. That is, the command and address cycles may be performed in series. Alternatively, the command and address cycles may be performed in parallel, i.e., the command and address cycles may be implemented in the same time period. In some embodiments, the command and/or address cycles may be started only when the low speed buffer is enabled. Optionally, the command cycle and/or address cycle may only be executed via the low speed buffer.

At 1630, the controller enables the high speed buffer and performs a data input cycle to buffer the data signals. In some embodiments, the controller activates the high speed mode and enables the high speed buffer when the CE_n/CLE/ALE/DQS_t signals are low. After the high speed buffer is enabled, the controller may perform one or more data input cycles. A command or address cycle and a data input cycle may be performed in series. For example, in a first time period, a command cycle or address cycle may be performed. In a second time period which follows the end of the first time period, a data input cycle may be carried out. Alternatively, a command or address cycle and a data input cycle may be performed in parallel. For example, in a first time period, a command cycle or address cycle may be performed. In a second time period which overlaps the first time period, a data input cycle may be carried out. In some embodiments, the high speed buffer may be enabled only when a data input cycle is performed.

Therefore, a low speed buffer and a high speed buffer may be used to buffer input signals. Command/address signals may be transmitted to the low speed buffer. Data signals may be transmitted to the high speed buffer. In comparison to cases where a high speed buffer is used to buffer command, address, and data signals, the active power and static power may be reduced.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for operating a memory device, comprising:
receiving an input of a command signal, an address signal, and a data signal simultaneously;
transferring the command signal, the address signal, and the data signal simultaneously to different buffers,
wherein the command signal and the address signal are transferred to a low speed buffer; and the data signal is transferred to a high speed buffer that operates at a speed higher than the low speed buffer;
performing a data input cycle by the high speed buffer, and
while performing the data input cycle by the high speed buffer, performing, by the low speed buffer, an address cycle and a command cycle by:
enabling the low speed buffer for performing the address cycle, and disenabling the low speed buffer when the address cycle ends, followed by enabling the low speed buffer again for performing the command cycle.

2. The method according to claim 1, further comprising:
performing at least one address cycle by the low speed buffer before performing the data input cycle, and
disenabling the low speed buffer and enabling the high speed buffer, for performing the data input cycle.

3. The method according to claim 1, further comprising:
transmitting the command signal or the address signal to the low speed buffer only; and
performing the command cycle using the low speed buffer only and/or performing the address cycle using the low speed buffer only.

4. The method according to claim 1, wherein performing the data input cycle by the high speed buffer comprises:
enabling the high speed buffer; and
performing the data input cycle to buffer the data signal using the high speed buffer.

5. The method according to claim 1, wherein:
the high speed buffer is enabled only when the data input cycle is performed.

6. The method according to claim 1, further comprising:
starting idle mode only when the high speed buffer is disenabled.

7. The method according to claim 1, further comprising:
detecting the command signal, the address signal, and/or the data signal from the input.

8. The method according to claim 1, wherein:
the high speed buffer operates at the speed higher-than the low speed buffer by a predetermined factor.

9. A memory device, comprising:
an input/output (I/O) component for receiving an input of a command signal, an address signal, and a data signal simultaneously;
a low speed buffer for buffering the command signal and the address signal;
a high speed buffer for buffering the data signal; and
a controller coupled to the I/O component, wherein
the I/O component is configured to simultaneously transmit the command signal, the address signal, and the data signal to different buffers, wherein the command signal and the address signal are transferred to the low speed buffer and the data signal is transferred to the high speed buffer that operates at a speed higher than the low speed buffer, and
the controller is configured to:
perform a data input cycle by enabling the high speed buffer, and
perform an address cycle and a command cycle by the low speed buffer,
while the data input cycle is performed, wherein
the low speed buffer is enabled for performing the address cycle, and
the low speed buffer is disenabled when the address cycle ends, followed by enabling the low speed buffer again for performing the command cycle.

10. The memory device according to claim 9, wherein the controller is further configured to:
transmit the command signal or the address signal to the low speed buffer only; and
transmit the data signal to the high speed buffer only.

11. The memory device according to claim 9, wherein the controller is further configured to:
perform the command cycle using the low speed buffer only and/or perform the address cycle using the low speed buffer only.

12. The memory device according to claim 9, wherein the controller is further configured to:
enable the high speed buffer; and
perform the data input cycle to buffer the data signal using the high speed buffer.

13. The memory device according to claim 9, wherein:
the high speed buffer is enabled only when the data input cycle is performed.

14. The memory device according to claim 9, wherein the controller is further configured to:
control the memory device to start idle mode only when the high speed buffer is disenabled.

15. The memory device according to claim 9, further comprising:
an input buffer control for detecting the command signal, the address signal, and/or the data signal from the input.

16. The memory device according to claim 9, further comprising:
a three-dimensional (3D) NAND memory device.

17. The memory device according to claim 9, wherein:
the high speed buffer operates at the speed higher than the low speed buffer by a predetermined factor.

18. The memory device according to claim 9, wherein the controller is further configured to:
perform at least one address cycle by the low speed buffer before performing the data input cycle, and
disenable the low speed buffer and enable the high speed buffer, for performing the data input cycle.

19. A method for operating a memory device, comprising:
receiving an input including a command signal, an address signal, and a data signal simultaneously;
transferring the command signal, the address signal, and the data signal simultaneously to different buffers;
enabling a high speed buffer and performing a data input cycle to buffer the high speed signal using the high speed buffer; and
while performing the data input cycle by the high speed buffer, performing an address cycle and a command cycle by a low speed buffer, wherein
the address cycle is performed by enabling the low speed buffer to buffer the address signal and disenabling the low speed buffer when the address cycle ends, followed by performing the command cycle by enabling the low speed buffer to buffer the command signal, and
the high speed buffer operates at a speed higher than the low speed buffer.

20. The method according to claim 19, wherein:
the high speed buffer operates at the speed higher than the low speed buffer by a predetermined factor.

* * * * *